(12) United States Patent
Sung

(10) Patent No.: US 10,996,698 B2
(45) Date of Patent: May 4, 2021

(54) OUTPUT CIRCUIT

(71) Applicant: Realtek Semiconductor Corporation, Hsinchu (TW)

(72) Inventor: Ya-Hsuan Sung, Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/922,339

(22) Filed: Jul. 7, 2020

(65) Prior Publication Data

US 2021/0011504 A1 Jan. 14, 2021

(30) Foreign Application Priority Data

Jul. 8, 2019 (TW) ................................. 108123984

(51) Int. Cl.
| | |
|---|---|
| *H03K 5/22* | (2006.01) |
| *H03K 5/24* | (2006.01) |
| *H03K 19/00* | (2006.01) |
| *H03K 19/0185* | (2006.01) |
| *G05F 1/56* | (2006.01) |
| *H03K 19/20* | (2006.01) |

(52) U.S. Cl.
CPC ............... *G05F 1/56* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 5,287,068 A | * | 2/1994 | Olmstead ................ | H03F 1/086 330/253 |
| 6,252,435 B1 | * | 6/2001 | Wu ........................ | H03F 3/4521 327/65 |
| 6,429,735 B1 | * | 8/2002 | Kuo ..................... | H03F 3/45183 327/112 |
| 6,844,781 B1 | * | 1/2005 | Walsh ................... | H03F 3/3022 330/252 |
| 7,190,193 B1 | * | 3/2007 | Ross .............. | H03K 19/018528 326/115 |
| 7,514,966 B2 | * | 4/2009 | Ho ....................... | H03K 5/2481 327/53 |
| 7,576,572 B2 | * | 8/2009 | Ball ....................... | H03K 5/088 327/63 |
| 8,476,935 B2 | * | 7/2013 | Wolf ....................... | H03K 5/08 327/66 |

(Continued)

*Primary Examiner* — Kenneth B Wells
(74) *Attorney, Agent, or Firm* — Locke Lord LLP; Tim Tingkang Xia, Esq.

(57) ABSTRACT

A circuit that includes an input stage circuit and an output stage circuit is provided. The input stage circuit includes a differential pair circuit and two output current mirror circuits. The differential pair circuit operates according to a first voltage source to receive a first and a second input voltages and generate a first and a second output currents. The two output current mirror circuits operate according to a second voltage source to generate a first current mirror output current fed to an input stage output node according to the first output current and generate a second current mirror output current flowed from the input stage output node according to the second output current. The output stage circuit operates according to the second voltage source to receive an input voltage from the input stage output node to generate an output voltage.

7 Claims, 2 Drawing Sheets

(56) References Cited

U.S. PATENT DOCUMENTS 10,574,221 B2 * 2/2020 Wang .................. H03K 5/2481
2016/0036397 A1 * 2/2016 Watanabe ............ H03F 3/4521
  330/295

* cited by examiner

OUTPUT CIRCUIT

RELATED APPLICATIONS

This application claims priority to Taiwan Application Serial Number 108123984, filed Jul. 8, 2019, which is herein incorporated by reference.

BACKGROUND

Field of Disclosure

The present disclosure relates to a circuit design technology. More particularly, the present disclosure relates to an output circuit.

Description of Related Art

Advance process may not be used in some circuit designs of the physical layer circuit such that the transistors in the circuits may have a higher threshold voltage. Under such a condition, if the output circuit operates according to a lower voltage, the gain of the circuit can not be increased due to the high threshold voltage of the transistors such that the output voltage may become inaccurate.

Accordingly, what is needed is an output circuit to address the above issues.

SUMMARY

An aspect of the present disclosure is to provide a circuit that includes an input stage circuit and an output stage circuit. The input stage circuit includes a differential pair circuit, a first output current mirror circuit, and a second output current mirror circuit. The differential pair circuit is configured to operate according to a first voltage source, configured to receive a first input voltage and a second input voltage, and configured to generate a first output current and a second output current according to the first input voltage and the second input voltage respectively. The first output current mirror circuit is configured to operate according to a second voltage source and to generate a first current mirror output current according to the first output current. The second output current mirror circuit configured to operate according to the second voltage source and to generate a second current mirror output current according to the second output current. The output stage circuit is configured to operate according to the second voltage source, and configured to receive an input voltage from an input stage output node and generate an output voltage according to the input voltage. The first current mirror output current is fed to the input stage output node and the second current mirror output current flows from the input stage output node. A voltage of the second voltage source is smaller than a voltage of the first voltage source.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
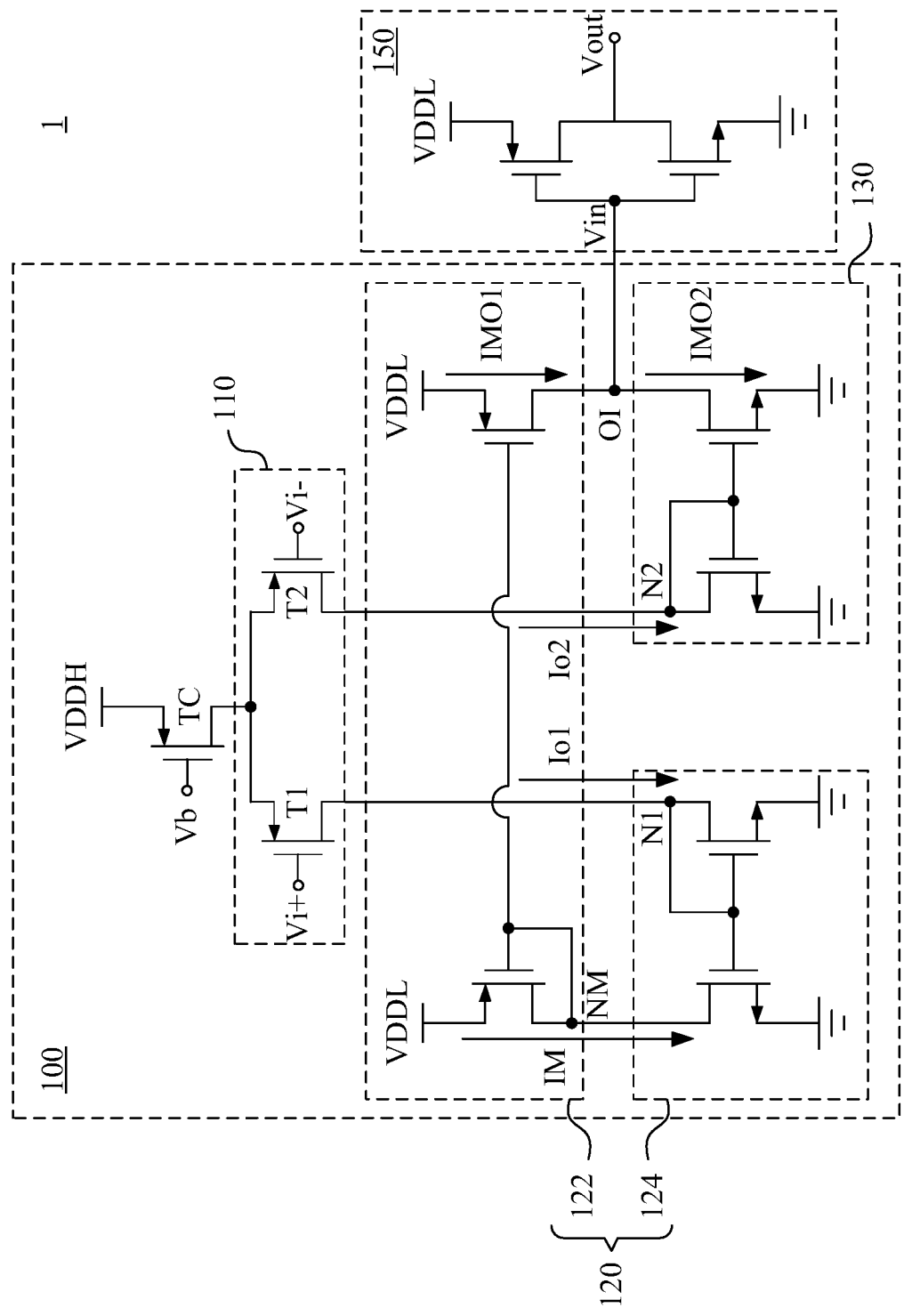
FIG. 1 is a circuit diagram of an output circuit in an embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

Reference is now made to FIG. 1. FIG. 1 is a circuit diagram of an output circuit 1 in an embodiment of the present invention. In an embodiment, the output circuit 1 is disposed in a universal serial bus (USB) type-C physical layer circuit. The output circuit 1 includes an input stage circuit 100 and an output stage circuit 150.

The input stage circuit 100 includes a differential pair circuit 110 and two output current mirror circuits 120 and 130.

The differential pair circuit 110 includes a first input transistor T1 and a second input transistor T2 that operate according to a first voltage source VDDH. In an embodiment, the voltage of the first voltage source VDDH can be such as, but not limited to 3.3 volts. The differential pair circuit 110 is electrically coupled to the first voltage source VDDH through a control transistor TC. The control transistor TC is controlled by a control voltage Vb such that the control transistor TC allows the differential pair circuit 110 to receive the voltage of the first voltage source VDDH when the control transistor TC is conducted.

The first input transistor T1 includes a control node, a first node and a second node. The control node is configured to receive a first input voltage Vi+, the first node is electrically coupled to the control transistor TC, and the second node is electrically coupled to a first differential output node N1. The first input transistor T1 is electrically coupled to the first voltage source VDDH through the control transistor TC and generates a first output current Io1 to the first differential output node N1 at the second node.

The second input transistor T2 includes a control node, a first node and a second node. The control node is configured to receive a second input voltage Vi−, the first node is electrically coupled to the control transistor TC, and the second node is electrically coupled to a second differential output node N2. The second input transistor T2 is electrically coupled to the first voltage source VDDH through the control transistor TC and generates a second output current Io2 to the second differential output node N2 at the second node.

The output current mirror circuit 120 is configured to operate according to a second voltage source VDDL. The voltage of the second voltage source VDDL is smaller than the voltage of the first voltage source VDDH. In an embodiment, the second voltage source VDDL can be such as, but not limited to 1.2 volts.

In the present embodiment, output current mirror circuit 120 includes a first current mirror 122 and a second current mirror 124. The first current mirror 122 is electrically coupled to the first differential output node N1 to receive the first output current Io1 and generate a mirrored current IM at a mirror node NM according to the first output current Io1. The second current mirror 124 is electrically coupled to the mirror node NM to receive the mirrored current IM from the mirror node NM and generate the first current mirror output current IOM1 according to the mirrored current IM.

The output current mirror circuit 130 is configured to operate according to the second voltage source VDDL. In the present embodiment, the output current mirror circuit 130 includes a third current mirror (not labeled) electrically coupled to the second differential output node N2 to receive the second output current Io2 from the second differential output node N2 and generate a second current mirror output current IOM2 according to the second output current Io2.

As illustrated in FIG. 1, the first current mirror output current IOM1 is fed to an input stage output node OI and the second current mirror output current IOM2 flows from the input stage output node OI. As a result, the voltage of the input stage output node OI is determined by the amount of the first current mirror output current IOM1 and the second current mirror output current IOM2. When the amount of the first current mirror output current IOM1 is larger than and the amount of the second current mirror output current IOM2, a high level voltage is outputted at the input stage output node OI. When the amount of the first current mirror output current IOM1 is smaller than and the amount of the second current mirror output current IOM2, a low level voltage is outputted at the input stage output node OI.

The output stage circuit 150 is configured to operate according to the second voltage source VDDL to receive an input voltage Vin from the input stage output node OI to generate an output voltage Vout. In the present embodiment, the output stage circuit 150 is an inverter such that the output voltage Vout is the inverse of the input voltage Vin. In other applications, the output stage circuit 150 can be a buffer such that the output voltage Vout is the same as the input voltage Vin.

In an embodiment, the ratio between the currents received and generated by each of the current mirrors is related to the ratio of the size of the transistors included in the current mirrors. In the present embodiment, the current mirrors that include the transistors having the same size are used as an example. As a result, the currents received and generated by each of the current mirrors are equal. However, in other embodiments, the ratio of the size of the transistors included in the current mirrors can be adjusted according to practical applications or requirements to generate currents having different magnitudes.

The operation of the output circuit 1 is further described in detail in the following paragraphs.

Since the differential pair circuit 110 receives differential inputs, when the first input voltage Vi+ is a high level voltage, the second input voltage Vi− is a low level voltage. Under such a condition, the first input transistor T1 turns off and the second input transistor T2 turns on to be conducted. As a result, the second output current Io2 is larger than the first output current Io1. Further, the second current mirror output current IOM2 mirrored from the second output current Io2 is larger than the first current mirror output current IOM1 mirrored from the mirrored current IM, in which the mirrored current IM is mirrored from the first output current Io1.

As a result, the input voltage Vin generated from the input stage output node OI that is further fed to the output stage circuit 150 is pulled to a low voltage level. After the process of the output stage circuit 150 implemented by the inverter, the output voltage Vout having a high voltage level is generated.

On the other hand, when the first input voltage Vi+ is a low level voltage, the second input voltage Vi− is a high level voltage. Under such a condition, the first input transistor T1 turns on to be conducted and the second input transistor T2 turns off. As a result, the first output current Io1 is larger than the second output current Io2. Further, the first current mirror output current IOM1 mirrored from the mirrored current IM is larger than the second current mirror output current IOM2 mirrored from the second output current Io2, in which the mirrored current IM is mirrored from the first output current Io1.

As a result, the input voltage Vin generated from the input stage output node OI that is further fed to the output stage circuit 150 is pulled to a high voltage level. After the process of the output stage circuit 150 implemented by the inverter, the output voltage Vout having a low voltage level is generated.

Figure 2:
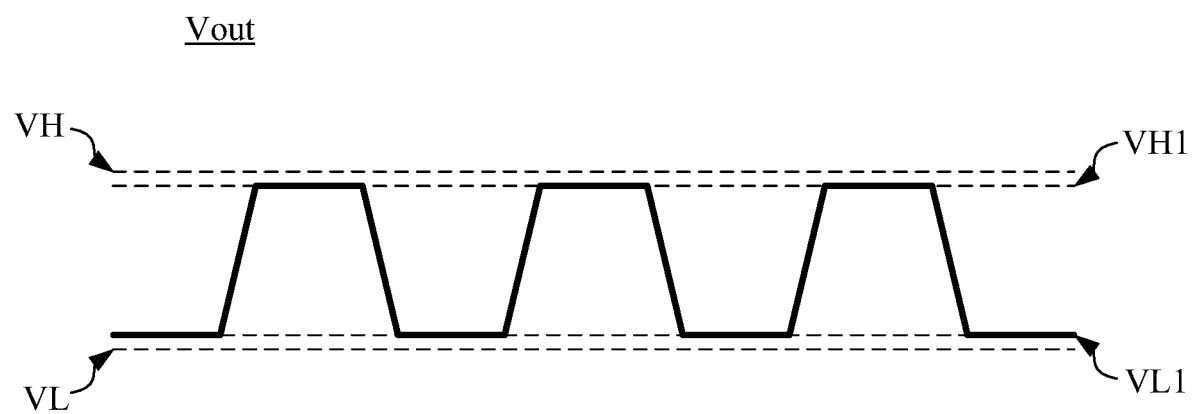
FIG. 2 is a diagram of the output voltage in an embodiment of the present invention.

Reference is now made to FIG. 2. FIG. 2 is a diagram of the output voltage Vout in an embodiment of the present invention.

In an embodiment, the ideal high voltage level of the output voltage Vout is VH, and the ideal low voltage level of the output voltage Vout is VL. However, due to the non-ideal condition of the circuits, the output voltage Vout can only reach an actual high voltage level VH1 and an actual low voltage level VL1.

In some approaches, all the circuit blocks included in the output circuit operate according to the same voltage source having a relatively low voltage. Under such a condition, when a plurality of transistors connected in series are presented in the configuration of the output circuit, the voltage of the voltage source is close to the total amount of the threshold voltages of these transistors. The voltage headroom of the gain stage is therefore not enough such that the gain of the input voltage drops dramatically. Accordingly, the difference between the actual high voltage level VH1 and the ideal high voltage level VH and the difference between the actual low voltage level VL1 and the ideal low voltage level VL are too large that may cause logic error of the output voltage Vout.

As a result, the differential pair circuit of the output voltage 1 of the present invention operates according to a higher voltage source to increase the gain. Not only the actual high voltage level VH1 becomes closer to the ideal high voltage level VH but also the actual low voltage level VL1 becomes closer to the ideal low voltage level VL, the increasing of the gain can be accomplished without additionally disposing a gain stage circuit. In an embodiment, the actual high voltage level VH1 can be smaller and within a 10% range of the ideal high voltage level VH, and the actual low voltage level VL1 can be smaller and within a 10% range of the ideal low voltage level VL.

As above mentioned, magnitudes of the first voltage source VDDH and the second voltage source VDDL represent only examples. In other embodiments, the magnitudes of the first voltage source VDDH and the second voltage source VDDL can be any values that are feasible. Preferably, a voltage of the first voltage source VDDH is larger than a sum of the voltage of the second voltage source VDDL, a control threshold voltage of the control transistor TC, and an input threshold voltage of either the first input transistor T1 or the second input transistor T2, such that the gain of the circuit can be increased sufficiently.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A circuit, comprising:
an input stage circuit including:
- a differential pair circuit configured to operate according to a first voltage source, configured to receive a first input voltage and a second input voltage, and configured to generate a first output current and a second output current according to the first input voltage and the second input voltage respectively;
- a first output current mirror circuit configured to operate according to a second voltage source and to generate a first current mirror output current according to the first output current; and
- a second output current mirror circuit configured to operate according to the second voltage source and to generate a second current mirror output current according to the second output current; and an output stage circuit configured to operate according to the second voltage source, and configured to receive a third input voltage from an input stage output node and generate an output voltage according to the third input voltage, wherein the first current mirror output current is fed to the input stage output node and the second current mirror output current flows from the input stage output node, and wherein a voltage of the second voltage source is smaller than a voltage of the first voltage source;

wherein the differential pair circuit comprises a first input transistor and a second input transistor, the voltage of the first voltage source is larger than a sum of the voltage of the second voltage source, a control threshold voltage of a control transistor, and an input threshold voltage of either the first input transistor or the second input transistor.

2. The circuit of claim 1, wherein the first output current mirror circuit includes:
a first current mirror and a second current mirror, wherein the first current mirror is electrically coupled to a first differential output node of the differential pair circuit to receive the first output current and generate a mirrored current at a mirror node according to the first output current, and the second current mirror is electrically coupled to the mirror node to receive the mirrored current from the mirror node and generate the first current mirror output current according to the mirrored current, and wherein the second output current mirror circuit includes:
a third current mirror electrically coupled to a second differential output node of the differential pair circuit to receive the second output current from the second differential output node and generate the second current mirror output current.

3. The circuit of claim 1, wherein the differential pair circuit receives the voltage of the first voltage source through the control transistor.

4. The circuit of claim 1, wherein the output stage circuit is a buffer.

5. The circuit of claim 1, wherein the output stage circuit is an inverter.

6. The circuit of claim 1, wherein the voltage of the first voltage source is 3.3 volts and the voltage of the second voltage source is 1.2 volts.

7. The circuit of claim 1, wherein the circuit is disposed in a universal serial bus (USB) type-C physical layer circuit.

* * * * *